United States Patent [19]

Kobayashi et al.

[11] Patent Number: 5,175,017
[45] Date of Patent: Dec. 29, 1992

[54] METHOD OF FORMING METAL OR METAL SILICIDE FILM

[75] Inventors: Nobuyoshi Kobayashi, Kawagoe; Hidekazu Goto; Masayuki Suzuki, both of Kokubunji; Yoshio Homma, Tokyo; Natsuki Yokoyama, Mitaka, all of Japan

[73] Assignee: Hitachi, Ltd., Tokyo, Japan

[21] Appl. No.: 646,423

[22] Filed: Jan. 28, 1991

[30] Foreign Application Priority Data

Jan. 29, 1990 [JP] Japan .................................. 2-16019
Jun. 22, 1990 [JP] Japan .................................. 2-162650
Aug. 13, 1990 [JP] Japan .................................. 2-211712

[51] Int. Cl.$^5$ .............................................. B05D 3/06
[52] U.S. Cl. ........................................ 427/8; 427/124; 427/126.1; 427/237; 427/238; 427/253; 427/255; 427/255.2; 427/255.7; 427/290; 427/294; 427/404; 427/419.7; 427/576; 427/578
[58] Field of Search ................. 427/8, 38, 55, 58, 253, 427/255, 255.1, 255.2, 256, 404, 124, 126.1, 237, 238, 255.7, 290, 294, 419.7

[56] References Cited

U.S. PATENT DOCUMENTS 3,697,343 10/1972 Cuomo et al. ..................... 156/13

OTHER PUBLICATIONS

1988 Materials Research Society, pp. 55-61 "Characterisation of Process Parameters for Blanket Tungsten Contact Fill", Schmitz.
Harada et al, Preheating Effect on Selectivity in Tungsten CVD, 1992 Conf. Pro. ILSI-VII, 1922 Materials Research Society.
Joshi et al, "The Roll of Process Parameters of Selective . . . ", 1989 Materials Research Society, pp. 85-92.

Primary Examiner—Bernard Pianalto
Attorney, Agent, or Firm—Fay, Sharpe, Beall, Fagan, Minnich & McKee

[57] ABSTRACT

In forming a metal or metal silicide film by CVD, a fluorosilane is used as a reaction gas, or a fluoro-silane is added to a source gas. Examples of the metal halide used in the present invention include fluorides and chlorides of tungsten, molybdenum, titanium, tantalum and niobium. Among them, fluorides of tungsten and molybdenum are more desirable particularly from the viewpoint of the availability of the deposited metal or metal silicide. It is preferred that the source gases, i.e. silane series gas and metal halide, be diluted with a carrier gas such as nitrogen, hydrogen, helium or argon, and this is also true of the fluoro-silane. The total pressure is preferably 0.01 to 10 Torr. The reaction temperature is desirably 200° to 800° C., more desirably 300° to 500° C. Plasma CVD instead of thermal CVD may be employed for the purpose of lowering the reaction temperature.

57 Claims, 10 Drawing Sheets

METHOD OF FORMING METAL OR METAL SILICIDE FILM

BACKGROUND OF THE INVENTION

The present invention relates to a method for forming a metal or a metal silicide film, and more particularly to a method of forming a metal or metal silicide film for electrode and interconnects of a semiconductor device through CVD.

A three dimensional structure of a semiconductor device element has been formed for the purpose of LSI. This requires a reliable multilevel metallization technique capable of coping with abrupt steps and, capable of coping with small and deep contacts as well. Under these circumstances, there has been active research and development in recent years regarding the techniques for forming metal and metal silicide films through CVD. Among the above-described techniques for forming a thin film through CVD, studies have been made on blanket W-CVD wherein metal and metal silicide films are deposited on the whole surface of a semiconductor substrate and selective W-CVD wherein metal silicide films are deposited only on the surface of a conductor, such as silicon, without deposition of the film on an insulating film. The blanket W-CVD has been studied mainly as a method of forming a thin film for electrode and interconnects, while the selective W-CVD has been studied mainly as a technique of filling for contacts and vias.

A selective W-CVD process widely known in the art comprises selectively depositing tungsten and molybdenum on silicon and a metal through the use of metal halides, such as $WF_6$ and $MoF_6$, and reducing gases, such as hydrogen and $SiH_4$. For example, U.S. Pat. No. 3,697,343 discloses a selective W-CVD process wherein $WF_6$ and hydrogen are used.

Japanese Patent Laid-Open No. 72132/1984 discloses selective W-CVD wherein $WF_6$ and $SiH_4$ are used. In this process, a sufficient deposition rate can be obtained at a temperature as low as 300° C., the surface morphology is very smooth and defects to the tungsten/silicon interface can be prevented because silicon is supplied from $SiH_4$ to reduce $WF_6$.

SUMMARY

It is an object of the present invention to find, analyze and solve problems of the prior art techniques in this field.

In the U.S. Pat. No. 3,697,343 selective process, the deposition temperature is usually as high as 450° C. or above. Therefore, when tungsten is deposited on a metal having a low melting temperature, the thermal stability of the metal is insufficient and the surface of the deposited tungsten film is remarkably rough. Further, the surface of silicon is etched by a product of a reaction of $WF_6$ with hydrogen, such as HF, which brings about defects such as encroachment of tungsten at the tungsten/silicon interface, so that the junction is broken unfavorably.

The Japanese Laid-Open process has drawbacks such as peeling of the film due to poor adhesion of the film to the substrate, variation in the deposition rate due to the deposition of tungsten on the wall of the apparatus and susceptor, and the occurrence of unnecessary W nucleation on an insulating film due to a lowering in the selectivity caused by reaction by-products, as compared with $H_2$ reduced CVD.

Blanket CVD of tungsten and tungsten silicide through the use of a metal halide, such as $WF_6$, and $SiH_4$, $SiH_2Cl_2$ or the like has also widely been studied in the art. In the blanket CVD wherein tungsten is deposited on a sputtering-deposited adhesion layer through the use of $WF_6$ and $SiH_4$, the tungsten deposition rate is limited by the mass transfer of $SiH_4$, which causes the step coverage in fine via holes to be remarkably lowered. In the $SiH_4$ reduced CVD, silicon is easily incorporated in the deposited tungsten. This brought about problems such as high stress and high resistivity of the film. Also in the case of the use of $WF_6$ and $SiH_2Cl_2$, the film deposition rate is limited by the mass transfer of $SiH_2Cl_2$, so that there occur problems such as low step coverage at abrupt steps, difficulty of controlling the reaction rate and frequent formation of particles during the process.

As described above, the $H_2$ reduced process and $SiH_4$ reduced process have both merits and demerits, which make it very difficult to simultaneously solve the problem of the selectivity, deposition rate, morphology of the surface of the film, encroachment, step coverage, stress, resistivity, etc. In particular, in the method wherein $WF_6$ and $SiH_4$ are used, a halide such as $WF_6$ reacts with $SiH_4$ to form, besides $SiH_4$, reaction by-products, such as $SiHF_3$, $SiH_2F_2$, and $SiF_4$, in a gaseous phase, so that is is very difficult to control the reaction rate because of the very complicate reaction pathway. This brought about selectivity loss problems in the case of the selective CVD, and in the case of blanket CVD it was difficult to realize good step coverage and decrease of the formation of particles. Further, since $SiH_4$ hardly exhibits the effect of etching the silicon oxide film, a native oxide tends to remain at the tungsten/silicon interface, so that the adhesion becomes poor, which is unfavorable.

Objects of the present invention include: to solve the problems of the conventional methods; to prevent reaction between the above-described various reaction products and the metal halide; to provide good control of the reaction rate; in the case of the selective CVD, ensure good selectivity; and in the case of the blanket CVD, ensure good step coverage, the decrease of the occurrence of encroachment and the decrease of the particles.

The above-described objects can be attained by forming a metal or metal silicide film by a CVD wherein a fluoro-silane is used instead of a source gas such as $SiH_4$ or $SiH_2Cl_2$, or CVD wherein a fluoro-silane is added to a source gas such as $SiH_4$ or $SiH_2Cl_2$. Examples of the metal halide used in the present invention include fluorides and chlorides of tungsten, molybdenum, titanium, tantalum and niobium. Among them, fluorides of tungsten and molybdenum are more desirable particularly from the viewpoint of the availability of the deposited metal or metal silicide.

It is preferred that the source gases, i.e. silane series gas and metal halide, be diluted with a carrier gas such as nitrogen, hydrogen, helium or argon, and this is also true of the fluorosilane. The total pressure is preferably 0.01 to 10 Torr. The reaction temperature is desirably 200° to 800° C., more desirably 300° to 500° C. Plasma CVD instead of thermal CVD may be employed for the purpose of lowering the reaction temperature.

BRIEF DESCRIPTION OF THE DRAWINGS

Further objects, features, and advantages of the present invention will become more clear from the following detailed disclosure.

DETAILED DISCLOSURE

The reactivity of a gas used as a reducing agent for the metal halide has a great affect on the deposition rate and step coverage of the film. When the reactivity of the reducing gas with the metal halide is high, the deposition rate becomes high. In this case, however, since the reducing gas is consumed before it reaches the bottom of the hole, the amount of the gas fed to the bottom of the hole is insufficient, so that the step coverage lowers. When the reactivity is low, the results are the opposite. The reactivity of $SiH_2F_2$ and $SiH_3F$ is lower than that of $SiH_4$ but far higher than that of hydrogen, i.e., it is between them. Therefore, when $SiH_2F_2$ and $SiH_3F$ are used, not only a sufficient deposition rate of 50 to 100 nm/min or higher can be obtained at a temperature of about 300° C., but also good step coverage can be realized. As with the $SiH_4$ reduced-process, since the deposition temperature is as low as 300° C., the surface migration of tungsten atoms can be prevented, so that the morphology of the surface of the deposited tungsten film is very smooth. Further, the low deposition temperature prevents the reaction of $WF_6$ with silicon and enables silicon to be fed from $SiH_2F_2$ and $SiH_3F$, so that the encroachment can be prevented.

The metal halide, such as $WF_6$, reacts with the $SiH_4$ on a heated substrate to form tungsten. This reaction, however, also produces fluoro-silanes ($SiH_3F$, $SiH_2F_2$, $SiHF_3$, etc.) through another reaction pathway, which is a new discovery and part of the present invention. These fluoro-silanes react again with the metal halide to particularly form a metal such as tungsten. For example, in the selective CVD wherein $WF_6$ and $SiH_4$ are used, the main reaction is one which produces $SiHF_3$. In this case, however, there exists also a reaction pathway through which $SiF_4$ is produced, which brings about the selectivity loss. Therefore, when a fluoro-silane is added to the $SiH_4$, it becomes possible to prevent or regulate the first-stage reaction of the metal halide with $SiH_4$ or the reaction which brings about the selectivity loss. This decreases the excessive gas-phase reaction and consequently promotes the deposition of tungsten by the surface reaction. As a result, in the case of the selective CVD the selectivity can be improved, and in the case of the blanket CVD it becomes possible to attain the formation of a film having good step coverage, the control of the reaction rate and the decrease in the formation of particles. Since the fluoro-silane has a larger capability of reducing a silicon oxide film than prior art gases used, the tungsten-silicon interface is clean after the deposition of tungsten, so that the interface characteristics such as adhesion and contact resistance are excellent.

The present invention will now be described in more detail by way of the following Examples.

EXAMPLE 1

Figure 1:
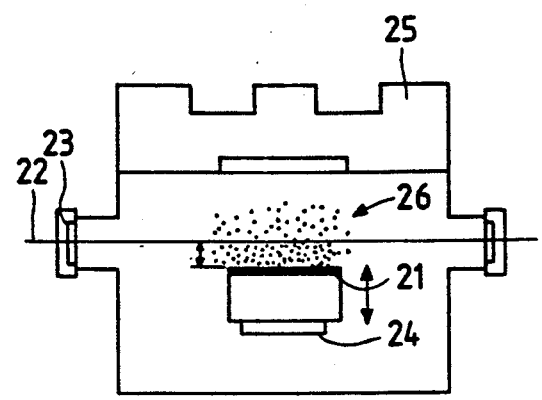
FIGS. 1 to 4 are diagrams illustrating Examples of the present invention.
Figure 2:
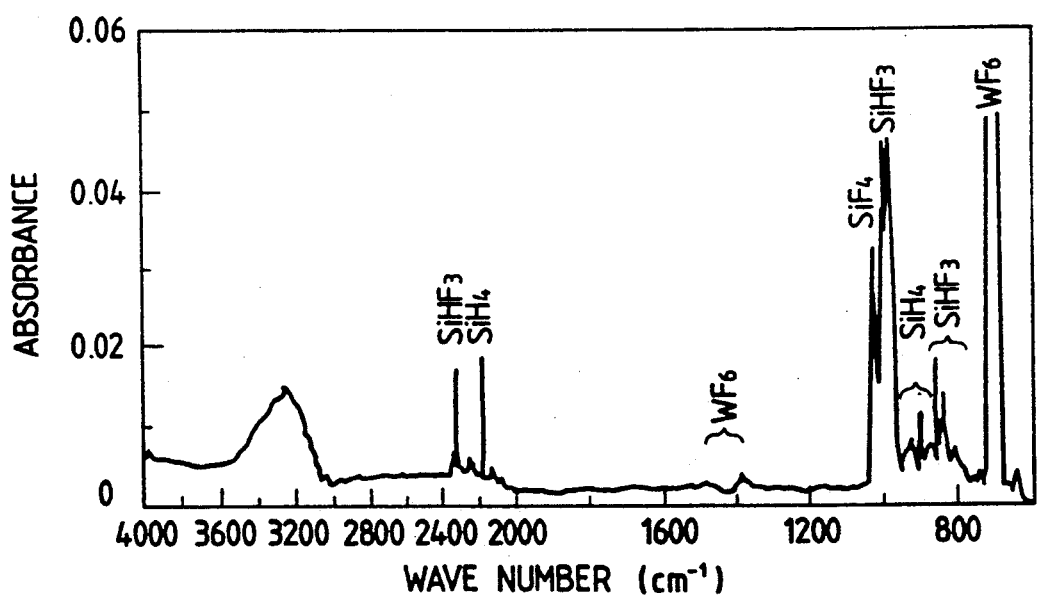
Figure 3:
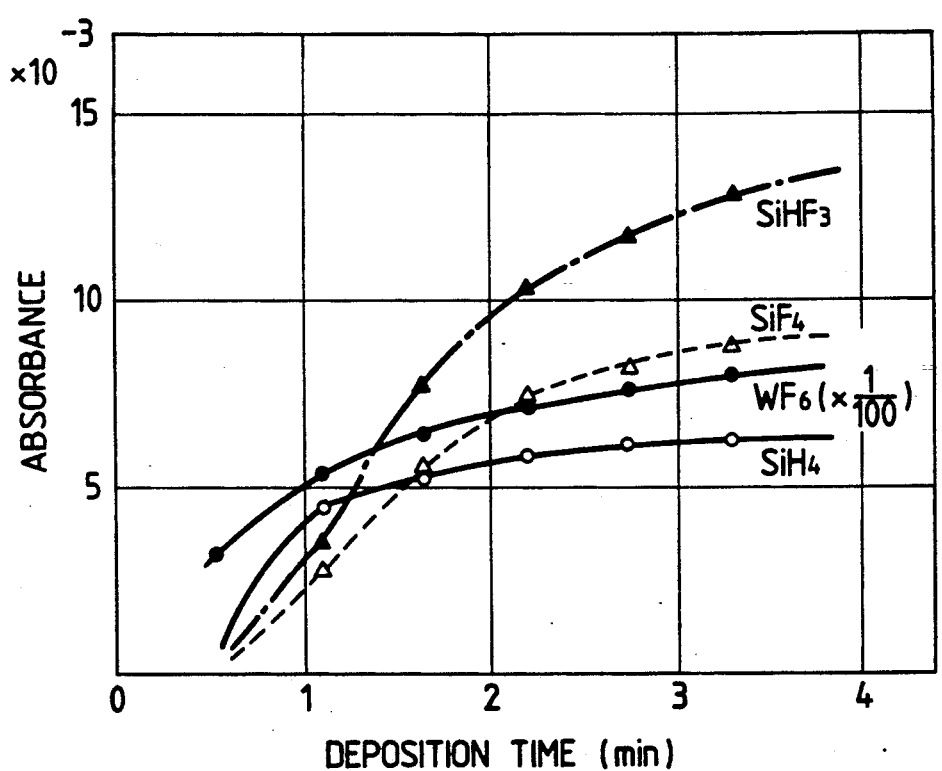

FIGS. 1 to 3 demonstrate the results of infrared spectroscopic analysis of a gas produced by a reaction during the selective CVD of a tungsten film through low-pressure CVD wherein $WF_6$ and $SiH_4$ are used. A sample substrate was prepared by depositing a 100 nm-thick tungsten film on a 4 in. silicon wafer by sputtering, depositing an 800 nm-thick silicon oxide film thereon by CVD, and forming square openings having sizes of 0.5 to 10 μm in the silicon oxide film by conventional photolithography to partially expose the surface of the tungsten. Tungsten was selectively deposited only on the tungsten-exposed surface of the sample substrate under CVD conditions of: a sample substrate temperature of 300 degrees C., a flow of $WF_6$ gas of 20 sccm (cm$^3$ per minute at 0 degrees Celsius and one atmosphere), a flow of $SiH_4$ gas of 4 sccm, a total pressure set at 0.64 Torr, and the use of nitrogen as a carrier gas.

FIG. 1 is a schematic view of a sample setup during infrared spectroscopic analysis. An infrared absorption spectrum of a reaction gas species 26 produced by the reaction was obtained by passing therethrough an infrared beam 22, in a rectangular form having a size of 5 nm×10 nm, parallel to and 1 cm above the sample substrate 21 during deposition of a tungsten film, with the beam being introduced through a KBr window 23. Instead of KBr, $CsO_2$, $BaF_2$ and ZnSe can be used for a window. The sample substrate may be heated by a lamp (not shown) or a heater 24 mounted on a sample base. In the present experiment, a lamp (not shown) in the lamp house 25 was used for the heating.

FIG. 2 shows an infrared absorption spectrum of a reaction gas during the W-CVD of FIG. 1. Peaks assignable to $SiHF_3$ (at 845 cm$^{-1}$, 859 cm$^{-1}$, 999 cm$^{-1}$ and 2315 cm$^{-1}$) and $SiF_4$ (1014 cm$^{-1}$) as reaction product gases were observed besides peaks assignable to $WF_6$ (absorption peak at 711 cm$^{-1}$, etc.) and $SiH_4$ (at 2189 cm$^{-1}$, etc.) as the source gases. This shows that $WF_6$ is reduced through a reaction with $SiH_4$ on the tungsten surface of the sample to form trifluoro-silane ($SiHF_3$) and $SiF_4$, as tungsten was selectively deposited. In this case the formed fluoro-silane partially contributes to the deposition of tungsten because it can reduce $WF_6$.

FIG. 3 is a graph showing a change with deposition time in the absorbance of the gas detected by the infrared absorption spectrum during the selective W-CVD of FIG. 1. The absorbance is an accumulated average value up to that time. The absorbance intensity of $WF_6$ is drawn to a scale of 1 to 100 because it is about 100 times larger than that of the other illustrated species. The absorbance of the source gases, i.e., $WF_6$ and $SiH_4$, becomes constant with time and reaches an equilibrium. The absorbance of $SiHF_3$ and $SiF_4$ increases with the deposition of the tungsten and gradually reaches an equilibrium. The intensity ratio of $SiHF_3$ to $SiF_4$ is substantially constant during the deposition of tungsten. These experimental results show that $SiHF_3$ and $SiF_4$ are produced simultaneously with the deposition of tungsten. In this experiment, tungsten began to deposit on the insulating film from about 2 min after the introduction of $WF_6$ and $SiH_4$, which brought about a selectivity loss. The amount of SiHF$_3$ and SiF$_4$ increased with the lowering in the selectivity.

By contrast, in a variation of the experiment wherein SiH$_2$F$_2$ was used as a fluoro-silane instead of SiH$_4$, SiF$_4$ was hardly detected by infrared spectroscopy, i.e., the reaction that forms SiF$_4$ was prevented. This facilitated the ensuring of the selectivity. The same results were obtained when SiH$_3$F was used as a fluoro-silane instead of SiH$_2$F$_2$.

EXAMPLE 2

Figure 4A:
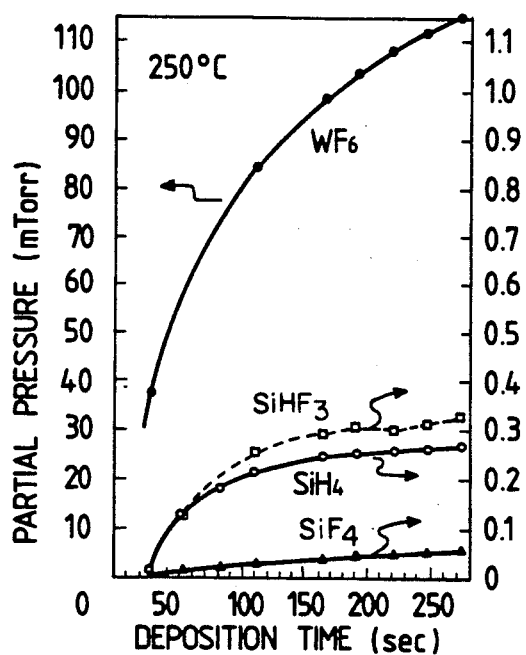
Figure 4B:
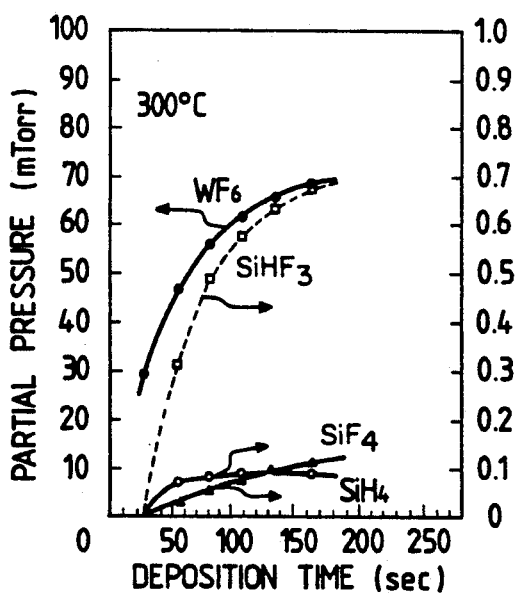
Figure 4C:
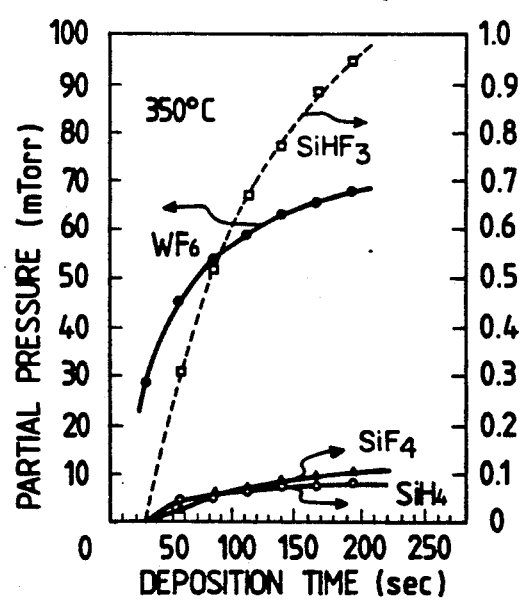

FIGS. 4(a)-(c) are graphs showing a change with time in the partial pressure of gas detected through an infrared absorption spectrum during selective W-CVD under conditions of the same gas flow rates and total pressure as those of Example 1 and substrate temperatures of 250, 300 and 350 degrees Celsius, respectively. The partial pressure was determined by calibrating the absorbance (accumulated time average value) of the infrared absorption spectrum. The partial pressure of the source gases, i.e., WF$_6$ and SiH$_4$, becomes constant with time and reaches an equilibrium. The partial pressure of SiHF$_3$ and SiF$_4$ increases with the deposition of tungsten and gradually reaches an equilibrium. The partial pressure of SiF$_4$ is as small as 1/10 of that of SiHF$_3$, which substantiates that the major reaction product in the selective CVD of tungsten is SiHF$_3$. The amount of SiHF$_3$ and SiHF$_4$ increased with a rise in the deposition temperature. Nucleation of tungsten occurred also on the insulating film with an increase in the deposition rate of tungsten, so that the selectivity was lowered. The increase in the amount of SiHF$_3$ corresponds to the increase of SiF$_4$. Specifically, the chemical reaction of the selective CVD is represented by the formula: WF$_6$+2SiH$_4$=W+2SiHF$_3$+3H$_2$. The chemical reaction represented by the formula WF$_6$+3/2SiH$_4$=W+3/2SiF$_4$3H$_2$ lowers the selectivity. Therefore it is seen that the flow rate of source gases is important. The selectivity at a ratio represented by the first formula is lowered by increasing the flow of SiH$_4$. As the ratio of SiH$_4$/WF$_6$ changes from 0 to about 2, the tungsten deposition rate increases with selective deposition, and thereafter the deposition rate stays about the same as the deposition becomes non-selective.

The deposition rate of tungsten on the sputtering-deposited tungsten film and the density of tungsten nuclei on an insulating film were determined under conditions of a flow of WF$_6$ as a source gas of 20 sccm, a flow of SiH$_4$ as another source gas of 8 sccm, an amount of addition of SiF$_4$ to the source gas of 1 to 300 sccm, a total pressure of 0.40 Torr, a deposition temperature of 300 degrees C and a deposition time of 5 to 8 minutes. The tungsten nuclei density was determined by counting the number of tungsten nuclei through the use of a scanning electron photomicrograph (SEM) ($\times$300). No variation in the tungsten deposition rate and tungsten nuclei density was observed when the flow of SiF$_4$ was increased from 1 to 10 sccm. When this rate was increased from 10 to 300 sccm, the tungsten deposition rate slightly decreased (10% at the maximum) while the tungsten nuclei density decreased by at least one order. In particular, when the flow of SiF$_4$ was 100 sccm or more, the tungsten nuclei density was remarkably improved. This is believed to result from the addition of SiF$_4$ preventing the occurrence of a side reaction which produces SiF$_4$. From the present Example, it is apparent that the addition of SiF$_4$ in a flow of not lower than that of SiH$_4$ is desired for the purpose of improving the selectivity.

In the present Example, SiF$_4$ was added for the purpose of improving the selectivity. Studies have been made also on the addition of SiHF$_3$ in a flow of 10 to 500 sccm for controlling the reaction rate. In general, in the W-CVD wherein use is made of SiH$_4$, since the reaction rate is high, the deposition rate is limited by the mass transfer of SiH$_4$, which makes it difficult to control the deposition rate. In the case of the blanket CVD on a sputtering-deposited metal film, the step coverage in fine via holes is unfavorably poor. The deposition rate of tungsten was about 100 nm/min under conditions of a flow of WF$_6$ of 20 sccm and a flow of SiH$_4$ of 8 sccm. The deposition rate decreased from 80 to 30 nm/min with an increase in the amount of addition of SiHF$_3$ from 50 to 200 sccm. This facilitated the control of the deposition rate and improved the film step coverage of fine via holes.

EXAMPLE 3

Figure 5A:
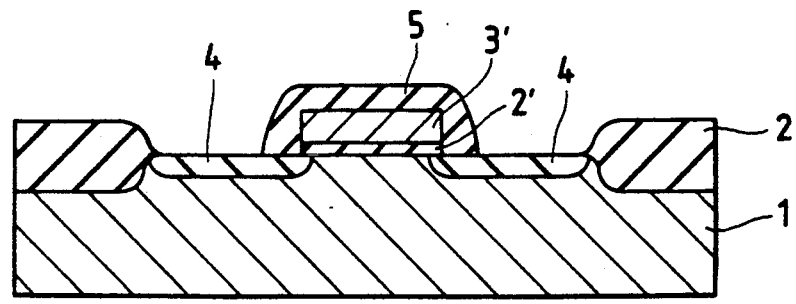
FIGS. 5(a) to (f) and FIGS. 6(a) to (e) are schematic cross-sectional views of semiconductor devices showing stepwise an example wherein tungsten is filled into the contacts in a MOSFET and via holes of the multi-level metallization.

FIGS. 5(a) to (f) are schematic cross-sectional views of a semiconductor device showing stepwise an example wherein tungsten is filled into the contacts in a MOSFET and via holes of the multilevel metallization. At the outset, as shown in FIG. 5(a), a field silicon oxide film 2 and a 15 nm-thick gate silicon oxide film 2 were formed on a p-type (100) silicon substrate 1, and a polycrystalline silicon film 3 (thickness: 300 nm) was deposited therein by low-pressure CVD. Thereafter doping was conducted for lowering the resistance, and patterning into a gate electrode was then conducted by conventional photolithography. Then, an ion implantation was conducted by making use of As ions through the use of the polycrystallate silicon gate electrode 3 as a mask, and heat treatment was then conducted to form a source/drain region 4. Thereafter, a SiO$_2$ film 5 was deposited by HLD (high-temperature low-pressure decomposition) and the whole surface thereof was subjected to dry etching to leave the HLD-SiO$_2$ film 5 only around the so-called LDD (lighly doped drain) structure.

Figure 5B:
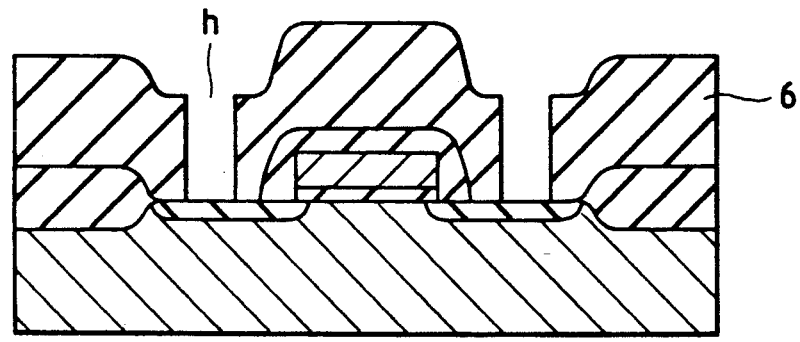

Thereafter, as shown in FIG. 5(b), an about 700 nm-thick BPSG (boron-doped PSG) film 6 was deposited by CVD and annealed in nitrogen at 900 degrees C for densification of the BPSG film, and a contact hole h having a width of 0.5 $\mu$m was formed by conventional photolithography.

Figure 5C:
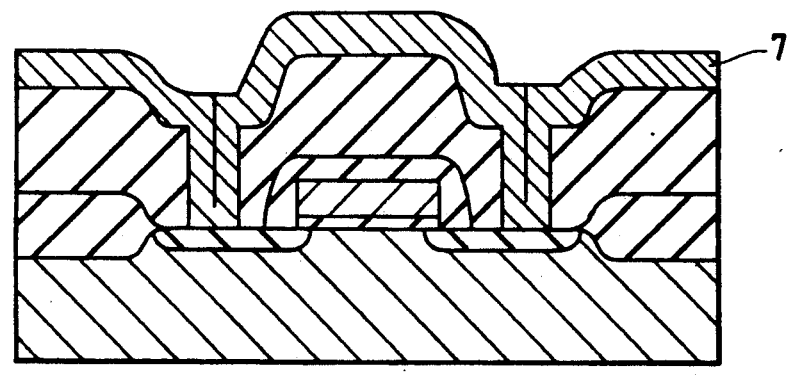

Then, as shown in FIG. 5(c), a 500 nm-thick tungsten (W) film 7 was deposited on the whole surface by low-pressure CVD wherein WF$_6$ and SiH$_2$F$_2$ were used as the source gas. The CVD was conducted under conditions of a flow of WF$_6$ gas of 80 sccm, a flow of SiH$_2$F$_2$ gas of 100 sccm, a total pressure set at 0.75 Torr through dilution with nitrogen, and a temperature of 500 degrees C. The tungsten film 7 thus formed was excellent in the step coverage on the contact hole h, and the morphology of the surface of the film was also excellent, i.e., very smooth. In the present Example 3, the tungsten film 7 was directly deposited on the insulating film. Alternatively, it is also possible to provide an adhesion layer of TiW, TiN, or sputtering-deposited tungsten film 7 between the insulating film 6 and the tungsten film for the purpose of further improving adhesion between the insulating film 6 and the tungsten film 7. Subsequently, the tungsten film 7 was fabricated into interconnections by conventional photolithography.

In the present Example, a tungsten film was formed by making use of WF$_6$ and SiH$_2$F$_2$. Alternatively, it is also possible to form a tungsten silicide film instead of the tungsten film by increasing the flow ratio of SiH$_2$F$_2$ to WF$_6$, for example, setting the flow of SiH$_2$F$_2$ and WF$_6$ respectively at 200 sccm and 80 sccm. SiHF$_3$ as well way be used for the deposition of a tungsten film or a tungsten silicide film. In this case, it is necessary to raise the deposition temperature (>600 degrees C.) above that used in the case of SiH$_2$F$_2$. Thus, as opposed to the prior art method wherein WF$_6$/SiH$_4$ is used, when a fluoro-silane was used, the quality of the tungsten silicide film and the step coverage were superior, and the formation of particles during the formation of the film could be reduced. In this case, however, the film thickness distribution lowers within a wafer of the deposited tungsten or tungsten silicide film when the total pressure becomes 10 Torr or more. For this reason it is preferred to conduct CVD at a low pressure of 10 Torr or less.

Figure 5D:
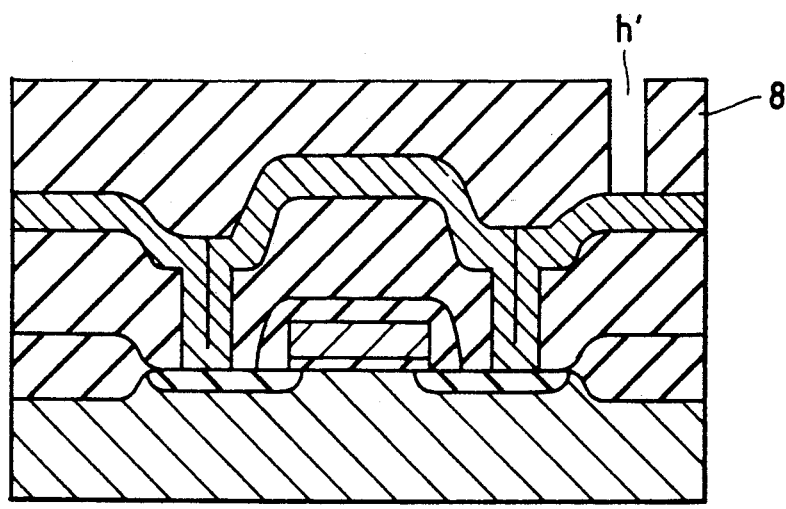

Thereafter, as shown in FIG. 5(d), a plasma SiO/-SOG (spin on glass)/plasma SiO multilayered film 8 (thickness: 300 nm/400 nm/300 nm; 1 μm in total) was deposited, and via holes h' having a width of 0.4 μm and reaching the tungsten film 7 were formed in the multilayered film 8 by conventional photolithography.

Figure 5E:
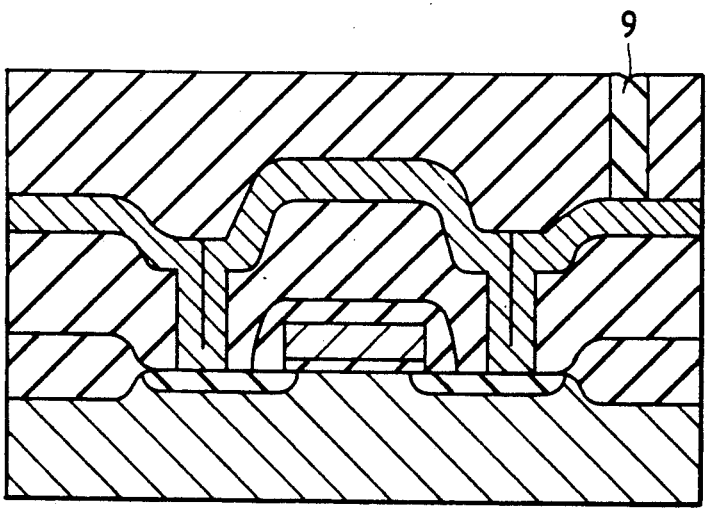

Thereafter, as shown in FIG. 5(e), tungsten 9 was selectively filled into the via holes h' by low pressure CVD wherein WF$_6$, SiH$_4$ and SiF$_4$ were used. The CVD was conducted under conditions of a flow of WF$_6$ gas of 20 sccm, a flow of SiH$_4$ gas of 5 sccm and a flow of SiF$_4$ gas of 50 sccm, a total pressure set at 0.2 Torr by dilution with hydrogen, and a temperature of 300 degrees C.

In the present Example 3, tungsten was selectively deposited on a tungsten film. It is also possible to selectively deposit tungsten on, besides the tungsten film, conductive films such as aluminum, molybdenum, TiN, TiW or silicide and semiconductors such as silicon.

Figure 5F:
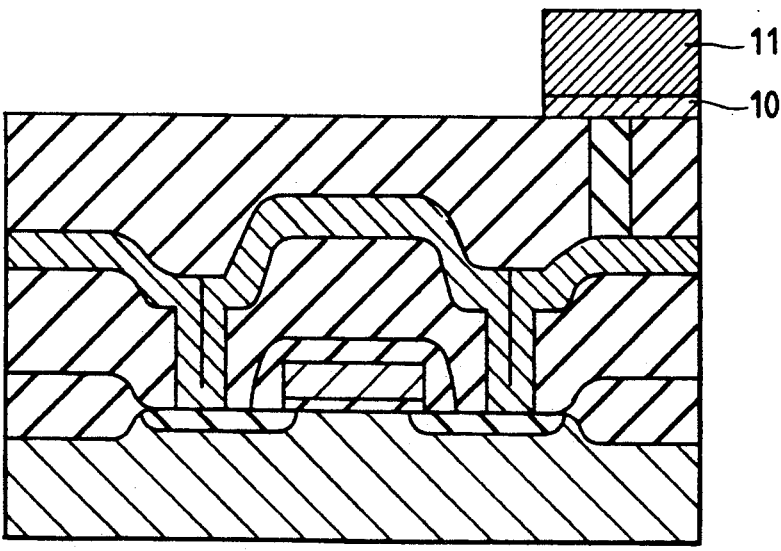

Thereafter, as shown in FIG. 5(f), a titanium-tungsten (TiW) film 10 (thickness: 150 nm) and an aluminum (Al) film 11 (thickness 800 nm) were successively deposited by sputtering, and aluminum interconnection was formed as the second level by conventional photolithography.

In the present Example 3, since the contact holes and via holes between interconnections were filled with the tungsten film 7 and the tungsten 9, multilevel metallization could be planarized, so that the problem of poor step coverage of aluminum interconnection could be remarkably alleviated. Further, the contact resistance with the source/drain and the interlevel contact resistance to the tungsten interconnection and aluminum interconnection were lower than those in the case where no tungsten was filled. The adhesion to the substrate was improved over that of the prior art wherein use was made of SiH$_4$, so that there occurred no problem of peeling of the tungsten film from the substrate. These results are believed to derive from the fact that a clean interface can be obtained because SiH$_2$F$_2$ used in the formation of the film reduces the silicon oxide film and the tungsten oxide film.

In the present Example 3, a tungsten interconnection was used as the first level interconnection. Alternatively, an aluminum interconnection may be used as the first level interconnection by leaving the tungsten film only within the contact hole through an etch-back process of the tungsten film and then depositing an aluminum film. In the present Example 3, thermal CVD was employed as the CVD. Alternatively, when the process temperature should be lowered, it is also possible to apply plasma CVD.

The interlevel dielectrics comprised a BPSG film 6 for the first level and a plasma SiO/SOG/plasma SiO multilayered film 8 for the second level. The same structure can be formed even when PSG of a heat-resistant organic polymer insulator of polyimide, etc., is used instead of the above-described dielectrics.

EXAMPLE 4

Figure 6A:
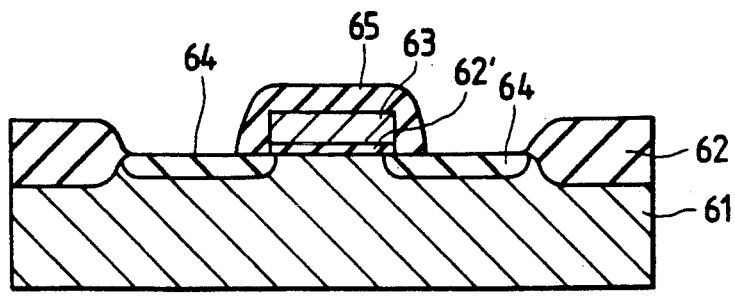

FIGS. 6(a) to (e) are schematic cross-sectional views of a semiconductor device showing stepwise an example wherein tungsten is filled into the contacts in a MOSFET and via holes of the multilevel interconnection. At the outset, as shown in FIG. 6(a), a field silicon oxide film 62 and a 15 nm-thick gate silicon oxide film 62' were formed on a p-type (100) silicon crystal substrate 61, and a polycrystalline silicon film 63 (thickness: 300 nm) was deposited thereon by low pressure CVD. Thereafter doping was conducted for lowering the resistance, and patterning into a gate electrode was conducted by conventional photolithography. Then, an ion implantation was conducted by making use of As ions through the use of the polycrystalline silicon film (gate electrode) 63 as a mask, and heat treatment was then conducted to form a source/drain region 64. Thereafter, a SiO$_2$ film 65 was deposited by HLD and the whole surface thereof was subjected to dry etching to leave the HLD film 65 only around the LDD structure.

Figure 6B:
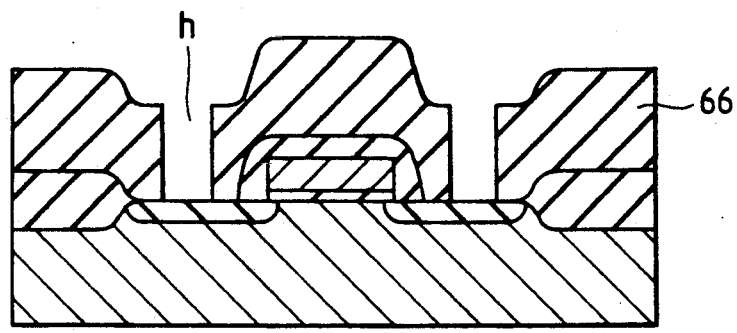
Figure 6C:
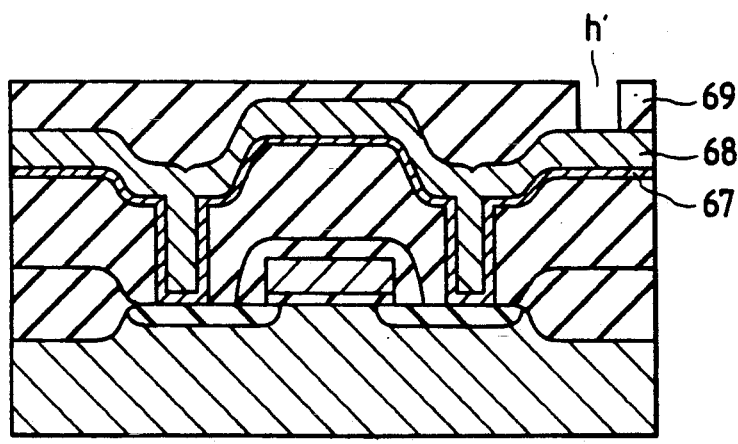

Thereafter, as shown in FIG. 6(b), an about 700 nm-thick BPSG (boron-doped PSG) film 66 was deposited thereon by CVD and annealed in nitrogen at 900 degrees C. for densification of the BPSG film, and contact holes h having a width of 0.5 μm were formed by conventional photolithography. Then, as shown in FIG. 6(c), a 150 nm-thick titanium nitride (TiN) film 67 was deposited as a barrier metal by reactive sputtering. Alternatively, the TiN film 67 may be formed by low-pressure thermal CVD or plasma CVD wherein use is made of TiCl$_4$. Thereafter, a 500 nm thick tungsten silicide film 68 was deposited on the whole surface thereof by blanket low-pressure CVD wherein WF$_6$, SiH$_4$ and SiHF$_3$ were used as the source gas. The CVD was conducted under conditions of a flow of WF$_6$ gas of 80 sccm, a flow of SiH$_4$ gas of 800 sccm, a flow SiHF$_3$ gas of 1000 sccm, a total pressure set at 0.75 Torr through dilution with nitrogen, and a temperature of 400 degrees C. The tungsten silicide film 68 thus formed was excellent in the step coverage in the contact hole h', and the morphology of the surface of the film was also excellent, i.e., very smooth.

In the present Example 4, an adhesion layer 67 (a TiW film, a TiN film, a sputtering-deposited tungsten film, etc.) was provided between the insulating film and the tungsten film for the purpose of further improving the adhesion between the insulating film 66 and the tungsten silicide film 68. Alternatively, it is also possible to directly deposit the tungsten silicide film 68 on the insulating film 66. Subsequently, the tungsten silicide film 68 was fabricated into interconnection by conventional photolithography. In the present Example 4, a tungsten silicide film 68 was formed by making use of WF$_6$ and SiH$_4$/SiHF$_3$. Alternatively, it is possible to form a tungsten film instead of the tungsten silicide film 68 by decreasing the flow ratio of WF$_6$/(SiH$_4$+SiHF$_3$), for example, setting the flow of $WF_6$, $SiH_4$ and $SiHF_3$ respectively at 80, 200 and 1000 sccm. $SiHF_3$ may be used alone for the formation of the tungsten or tungsten silicide film. In this case, it is necessary to raise the deposition temperature (>600 degrees C.) above that used in the case of $SiH_4$. Thus, as opposed to the prior art method wherein $WF_6$ and $SiH_4$ were used, when a fluoro-silane was used, the quality of the tungsten silicide film 68 and the step coverage were superior, and the formation of particles during the formation of the film could be reduced. In this case, however, the film thickness distribution lowers within a wafer of the deposited tungsten or tungsten silicide film when the total pressure becomes 10 Torr or more. For this reason, it is preferred to conduct the CVD under a low pressure of 10 Torr or less.

Thereafter, a shown in FIG. 6(c), a plasma SiO/SOG (spin on glass)/plasma SiO multilayered film 69 (thickness: 300 nm/400 nm/300 nm; 1 μm in total) was deposited, and via holes h' having a diameter of 0.4 μm and reaching the tungsten film 68 were formed in the multilayered film 69 by conventional photolithography.

Figure 6D:
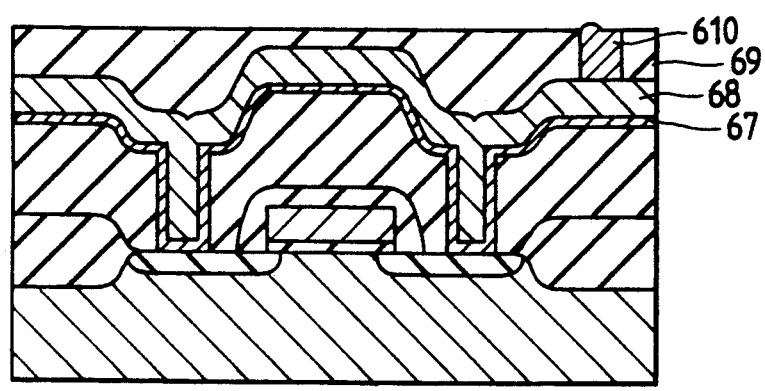

Thereafter, as shown in FIG. 6(d), tungsten 610 was selectively filled into the via hole h' by low pressure CVD wherein $WF_6$, $SiH_4$ and $SiF_4$ were used. The CVD was conducted under conditions of a flow of $WF_6$ gas of 20 sccm, a flow of $SiH_4$ gas of 5 sccm, a flow of $SiF_4$ gas of 50 sccm, a total pressure set at 0.2 Torr by dilution with hydrogen, and a temperature of 300 degrees C.

In the present Example 4, tungsten has selectively deposited on a tungsten film. It is also possible to selectively deposit tungsten on, besides the tungsten film, conductive films such as aluminum, molybdenum, TiN, TiW or silicide and a semiconductor such as silicon.

Figure 6E:
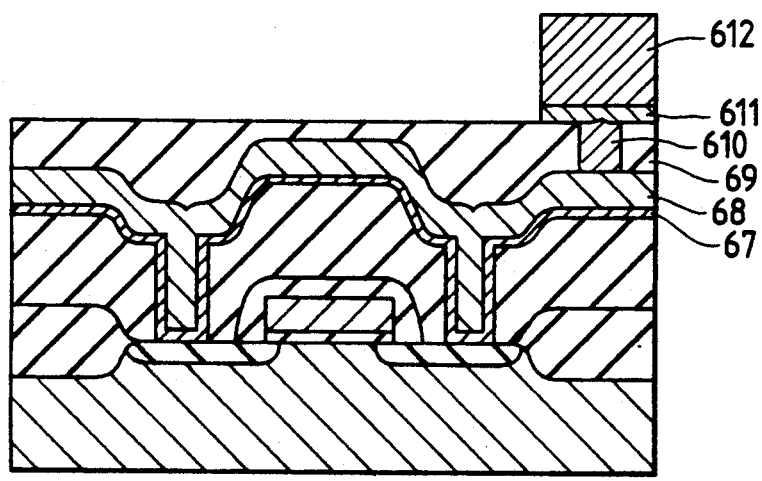

Thereafter, as shown in FIG. 6(e), titanium-tungsten (TiW) film 611 (thickness: 150 nm) and an aluminum (Al) film 612 (thickness: 800 nm) were successively deposited by sputtering, and aluminum interconnection was formed as the second level by conventional photolithography.

In the present Example 4, since the contact holes h and via holes h' between interconnections were filled with the tungsten silicide film 68 and the tungsten 610, an even multilevel metallization structure could be planarized, so that the problem of poor step coverage of aluminum interconnection could be remarkably alleviated. Further, the contact resistance with the source/drain and the interlevel contact resistance of the tungsten interconnection and aluminum interconnection were lower than those in the case where no tungsten was filled. The adhesion to the substrate was improved over that of the prior art wherein use was made of $SiH_4$, so that there occurred no problem of peeling of the tungsten film from the substrate. These results are believed to derive from the fact that a clean interface can be obtained because $SiHF_3$ used in the formation of the film can reduce the silicon oxide film and the tungsten oxide film.

In the present Example 4, a tungsten interconnection was used as the first level interconnection. Alternatively, an aluminum interconnection may be used as the first level interconnection by leaving the tungsten film only with the contact hole by using means such as an etch-back process of the tungsten film and then depositing an aluminum film. In the present Example, thermal CVD was employed as the CVD. Alternatively, when the process temperature should be lowered, it is also possible to apply plasma CVD.

The interlevel dielectrics comprised a BPSG film 66 for the first level and a plasma SiO/SOG/plasma SiO multilayered film 69 for the second level. The same structure can be formed even when PSG or a heated-resistant organic polymer insulator of polyimide, etc., is used instead of the above-described dielectrics.

EXAMPLE 5

A sample substrate 1 was prepared by thermally oxidizing a 4 in.-thick silicon substrate, forming a 1 μm-thick silicon oxide film on the surface thereof and then depositing a 100 nm-thick tungsten film by sputtering. A tungsten film was formed on the sample substrate 1 by CVD wherein $WF_6$ and $SiH_2F_2$ were used. The apparatus used was a cold wall type low-pressure CVD apparatus, and the sample substrate 1 was heated by means of an infrared lamp.

The sample substrate 1 was heated to 300 degrees. The flow of $WF_6$ and $SiH_2F_2$ were 20 and 30 sccm, respectively, and nitrogen was flowed as a carrier gas at a flow of 500 sccm to set the total pressure at 0.4 Torr. The deposition of tungsten was conducted for 15 min, thereby forming a 200 nm-thick tungsten film. The resistivity of the resultant tungsten film was 10 $\mu\Omega$ cm. This value is ⅔ of the resistivity (15 mcm) of a tungsten film formed by the $SiH_4$-reduced process under conditions of a substrate temperature of 350 degrees C., a $WF_6$ flow of 20 sccm and a $SiH_4$ flow of 20 sccm, and comparable to the resistivity (8 to 12 $\mu\Omega$ cm) in the case of the hydrogen-reduced process.

Similar experiments to the first example were conducted with variation only in the deposition temperature and the flow of $SiH_2F_2$. The deposition rates of the resultant tungsten film are given in Table 1.

TABLE 1

| | [Deposition Rate of W (nm/min)] | | |
|---|---|---|---|
| $SiH_2F_2$ gas flow (sccm) | 30 | 60 | 90 |
| Deposition Rate of W at 300° C. | 15 | 40 | 50 |
| Deposition Rate of W at 350° C. | 15 | — | — |
| Deposition Rate of W at 400° C. | 20 | — | 70 |

TABLE 2

| source | resist. | T° C. | step coverage | surface morphology | Si defect | selectivity | adhesion |
|---|---|---|---|---|---|---|---|
| $H_2/WF_6$ | 8–10 | 500 | good | rough | yes | ? | good |
| $SiH_4/WF_6$ | 10–15 | 300 | poor | smooth | no | ? | poor |
| $SiH_4/WF_6$ + $SiF_4$ | 10–15 | 300 | poor | smooth | — | good | good |
| $SiH_2F_2/WF_6$ | 12–16 | 300–400 | good | smooth | no | ? | good |
| $SiH_4/WF_6$ + $SiHF_3$ | 10–15 | — | good | — | — | ? | — |

Table 2 is a summary of experimental results where good results for step coverage and surface morphology indicate usefulness for tungsten blanket deposition, and good results for no silicon defect and good selectivity indicate usefulness for selective deposition of tungsten.

In these experiments, the results of which are shown in Table 1, tungsten films having a maximum thickness of 1 μm were formed. None of them brought about peeling. In the case of the SiH$_4$-reduced process, peeling occurred when the thickness of the deposited film became 300 mm or more. By contrast, it is apparent that when the SiH$_2$F$_2$ is used, the stress of the tungsten film becomes small. The composition of the resultant tungsten film was determined by the Auger electron spectroscopy. As a result no silicon was detected. This shows that a film having a low resistivity and small stress could be formed by virtue of the absence of silicon in the tungsten film. The observation of the surface of the deposited tungsten film under a scanning electron microscope (SEM) has revealed that the surface was very smooth, substantially equal to that of a tungsten film formed by the SiH$_4$-reduced process and improved over that of a tungsten film formed by the H$_2$-reduced process.

In the above-described Example, tungsten was deposited on a tungsten film. The deposition of tungsten can be on, besides the tungsten film, a substrate having 100-nm thick aluminum, TiN, TiW, or sputtering-deposited tungsten silicide films and a silicon substrate in the same manner as that used in the above Examples. As a result, tungsten was deposited at an equivalent deposition rate. When MoF$_6$ is used instead of WF$_6$, a molybdenum film can be formed instead of the tungsten film.

EXAMPLE 6

Figure 7A:
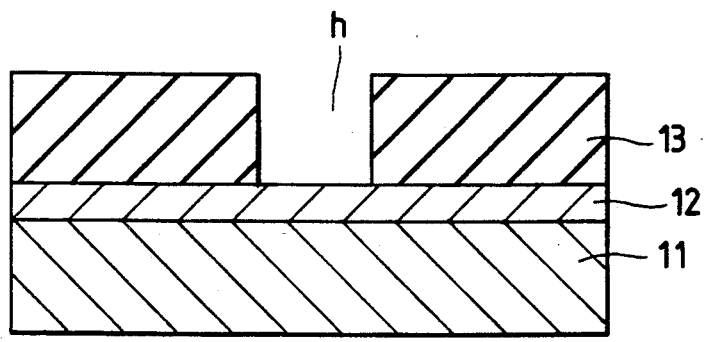
FIG. 7 is a diagram for illustrating the second Example of the present invention.

A sample substrate shown in FIG. 7(a) was prepared by depositing a 100 nm-thick tungsten film 12 on a 4-in. thick silicon substrate 11 by sputtering, depositing an 800 nm-thick silicon oxide film 13 thereon by CVD and forming holes of 0.5 to 10 mm squares in the silicon oxide film by conventional photolithography to partially expose the surface of tungsten.

Figure 7B:
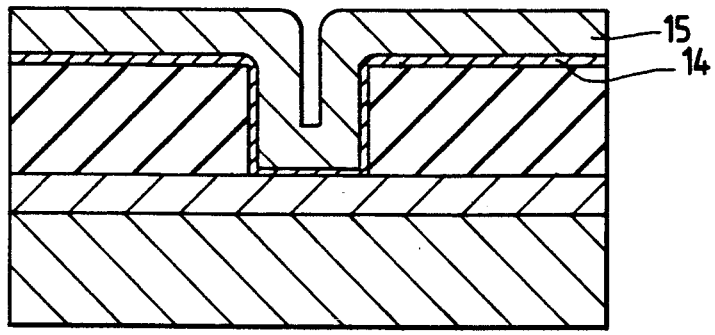

A 30 nm-thick tungsten film was deposited on the sample substrate in FIG. 7(b), and a tungsten film 15 was formed on the whole surface by CVD wherein use was made of SiH$_2$F$_2$. The deposition of tungsten was conducted for 9 min under conditions of a temperature of 300° C., a flow of WF$_6$ of 20 sccm, a flow of SiH$_2$F$_2$ of 90 sccm, a flow of nitrogen of 500 sccm, and a total pressure of 0.4 Torr. FIG. 7(b) is a cross sectional view of the resultant multilayered film. The step coverage was 0.9 in a hole h having a diameter or 0.9 μm, and the hole having a diameter of 0.2 μm could be completely filled with tungsten. This value is slightly smaller than a step coverage of 0.6 in the case where a tungsten film is formed by the SiH$_4$-reduced process under conditions of a substrate temperature of 300° C., a flow of WF$_6$ of 20 sccm and a flow of SiH$_4$ of 20 sccm.

Figure 7C:
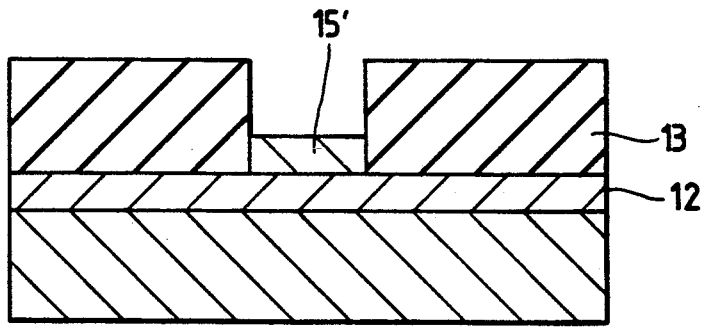

Subsequently, as shown in FIG. 7(c), a tungsten film 15' was directly deposited on another sample substrate of FIG. 7(a) by CVD without deposition of a tungsten film by sputtering. The CVD was conducted under conditions of a temperature of 300° C., a flow of WF$_6$ of 20 sccm, a flow of SiH$_2$F$_2$ of 30 sccm, a flow of nitrogen of 500 sccm, and a total pressure of 0.6 Torr. The deposition of the tungsten was conducted for 10 min. As a result, it has been found that, as shown in FIG. 7(c), a 200 nm-thick tungsten film 15' was formed only on the tungsten 12 within the openings of the silicon oxide film, that is, the deposition for the tungsten was selective. Then, the deposition time was prolonged to 20 min to deposit a tungsten film having a thickness of 400 nm. The observation of the surface of the sample substrate has revealed that no tungsten nucleation occurred in the silicon oxide film. When a 400 nm-thick tungsten film was formed by the SiH$_4$-reduced process, a number of tungsten nuclei were formed on the silicon oxide film. Therefore, it is apparent that the use of SiH$_2$F$_2$ improves the selectivity.

Then, a sample substrate 1b was prepared by depositing an 800-thick silicon oxide film 13 on a 5 in thick silicon substrate 11 by CVD and forming openings having a size of 0.5 to 10 mm squares in the silicon oxide film 13 by conventional photolithography to partially expose the surface of the silicon substrate. Tungsten was deposited on the substrate 1b for 15 min under conditions of a temperature of 300° C., a flow rate of WF$_6$ of 20 sccm, a flow rate of SiH$_2$F$_2$ of 300 sccm, a flow rate of nitrogen of 500 sccm and a total pressure of 1.0 Torr. Thereafter, the tungsten film thus formed was removed with aqueous hydrogen peroxide, and the sample substrate 1b was observed under SEM. As a result, no encroachment was observed.

EXAMPLE 7

Figure 8D:
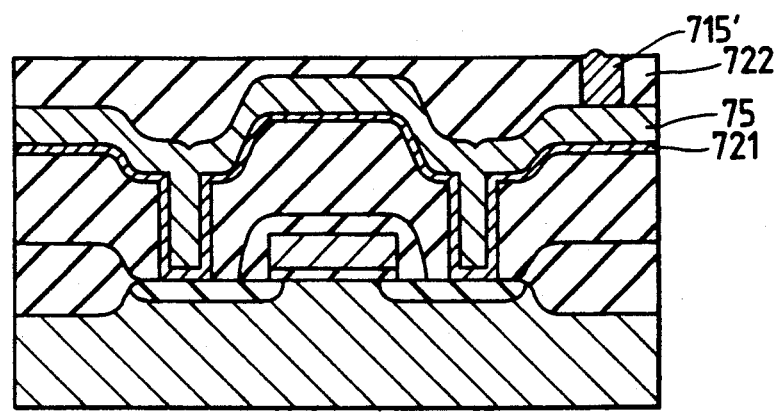
FIG. 8 shows a manufacturing process of a MOSFET in the third example of the present invention.
Figure 8E:
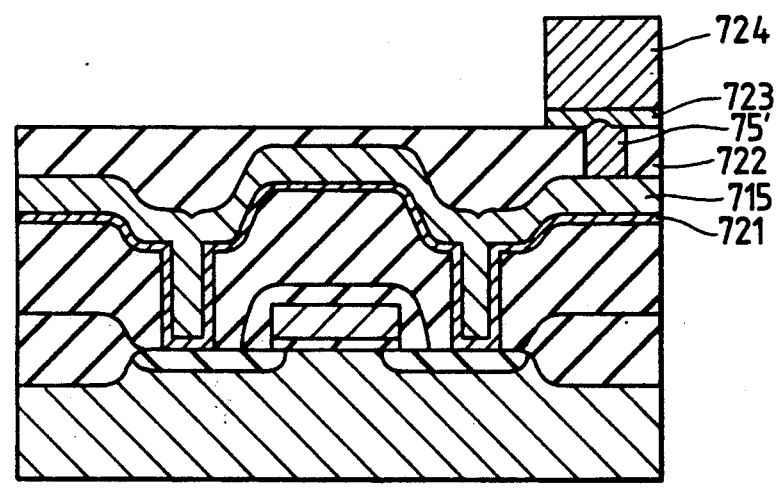
Figure 8A:
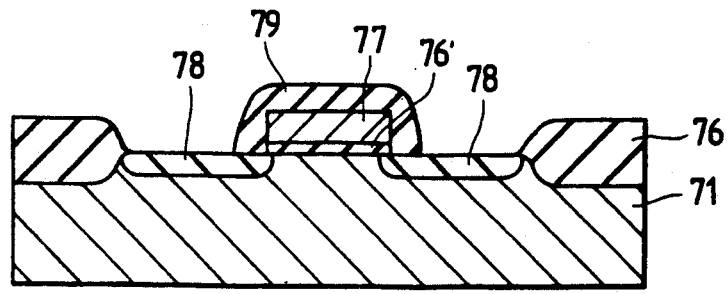

FIGS. 8(a) to (e) show a manufacturing process of an example wherein tungsten is filled into a contact portion and a multilevel interconnection to prepare a MOSFET. At the outset, as shown in FIG. 8(a), a field oxide film 76 and a 15 nm-thick gate oxide film 76' were formed on a p-type (100) silicon substrate 71, and a polycrystalline silicon film 77 (thickness: 300 nm) was deposited thereon by low-pressure CVD. Thereafter doping was conducted for lowering the resistance, and patterning into a gate electrode was then conducted by conventional photolithography. Then, As ions were implanted through the use of the polycrystalline silicon gate electrode 77 as a mask under conditions of an energy of 80 keV and a dose of $1 \times 10^{15}$ cm$^2$, and a heat treatment was then conducted at 900° C. for 10 min to form a source/drain region 78. Thereafter, a SiO$_2$ film 79 was deposited by HLD and the whole surface thereof was subjected to dry etching to leave the HLD film 79 around the periphery of the gate, thereby forming the LDD structures.

Figure 8B:
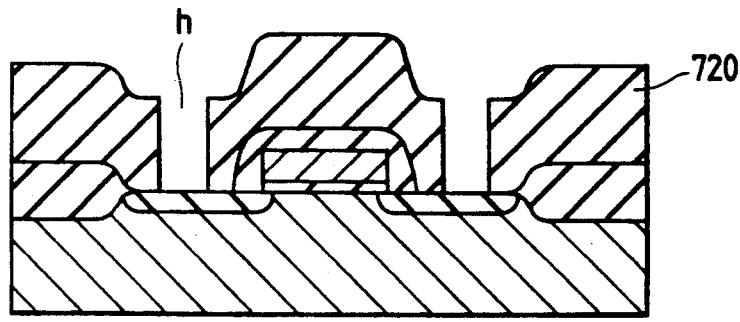

Thereafter, as shown in FIG. 8(b), an about 700 nm-thick BPSG (boron-doped PSG) film 720 was deposited thereon by CVD and annealed in nitrogen at 900° C. for densification of the BPSG film 720, and contact holes h having a diameter of 0.5 μm were formed by conventional photolithography.

Figure 8C:
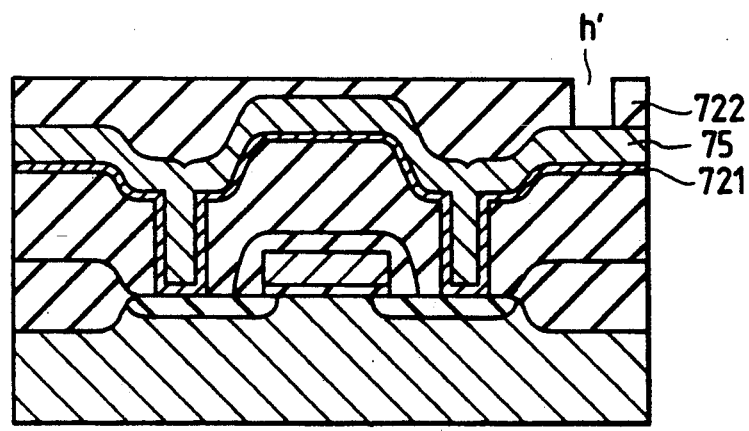

Then, as shown on FIG. 8(c), a 100-nm thick TiN film 721 was deposited as an adhesion layer by CVD. The CVD was conducted under conditions of a substrate temperature of 700° C., a flow of TiCl$_4$ of 10 sccm, a flow of NH$_3$ of 100 sccm, a total pressure of 0.2 Torr, and a deposition time of 1 min. Thereafter, a 500 nm-thick tungsten film 715 was deposited on the whole surface thereof by low-pressure CVD wherein WF$_6$ and SiH$_2$F$_2$ were used as the source gas. The CVD was conducted under conditions of a flow of WF$_6$ of 20 sccm, a flow of SiH$_2$F$_2$ of 90 sccm, a flow of nitrogen of 500 sccm, a total pressure of 0.5 Torr, and a temperature of 300° C. The contact hole h was completely filled with tungsten by this CVD. In the present Example, A TiN 721 film was formed as the adhesion layer by CVD. Alternatively, it is also possible to use a TiW film etc. as the adhesion layer, Subsequently, the TiN film 721 and the tungsten film 715 were fabricated into interconnection by conventional photolithography. In the present Example, a tungsten film 715 was formed by making use of $WF_6$ and $SiH_2F_2$. Alternatively, it is also possible to form a tungsten silicide film instead of the tungsten film by increasing the flow ratio of the $SiH_2F_2$ to $WF_6$, for example, by setting the flow of $WF_6$ and $SiH_2F_2$ respectively at 80 and 2000 sccm, and raising the temperature to 500° C. Thus, as opposed to the conventional $SiH_4$-reduced process, the use of $SiH_2F_2$ could reduce the stress of the tungsten silicide film, prevent the peeling of the film, provide excellent step coverage, and reduce the formation of particles. In this case, however, the film thickness distribution lowers within a wafer of the deposited tungsten or tungsten silicide film when the total pressure becomes 10 Torr or more. On the other hand, with the total pressure of 1 mTorr or less, no sufficient deposition rate can be obtained. For this reason, it is preferred to conduct the CVD under a pressure of 1 mTorr to 10 Torr. Thereinafter, a plasma SiO/SOG (spin on glass/plasma SiO multilayered film 722 (thickness: 300 nm/400 nm/300 nm; 1 μm in total) was deposited, and contact holes h' having a diameter of 0.4 μm and reaching the tungsten film 715 were formed in the multilayered film 722 by conventional photolithography.

Thereafter, as shown in FIG. 8(d), tungsten 715' was selectively filled into the contact holes h' by low pressure CVD wherein $WF_6$ and $SiH_2F_2$ were used. The CVD was conducted under conditions of a flow of $WF_6$ of 20 sccm, a flow of $SiH_2F_2$ of 30 sccm, a flow of nitrogen of 500 sccm, a total pressure of 0.6 Torr, and a temperature of 400° C. In the present Example, tungsten 715' was selectively deposited on the tungsten film 715. It is also possible to deposit and aluminum film on a tungsten film 715 to form an aluminum/tungsten multilayered interconnection structure as the first level followed by selective deposition of tungsten 715' on aluminum.

Thereafter, as shown in FIG. 8(e), a TiW film 723 (thickness: 150 nm) and an aluminum film 724 (thickness: 800 nm) were successfully deposited by sputtering, and aluminum interconnection was formed as the second level by conventional photolithography.

In the present example, since the contact holes h and via holes h' between interconnections were filled with the tungsten film 175 and the tungsten film 715', multilevel interconnection structure could be planarized, so that the problem of poor step coverage of aluminum could be remarkably alleviated. Further, the contact resistance of contact with the sources and the drain and the via resistance of the tungsten interconnections aluminum interconnection were lower than those in the case where no tungsten was filled. Since the stress becomes lower than that in the prior art method wherein use is made of $SiH_4$, there occurred no problem of peeling of the tungsten film from the substrate.

The interlevel dielectrics comprised a BPSG film 720 for the first level and a SiO/SOG plasma, SiO multilayered film 722 for the second level. The same structure can be formed even when PSG of a heat-resistant organic polymer insulator of polyimide, etc. is used instead of the above-described dielectrics.

According to the present invention, a sufficient deposition rate can be attained at a low temperature, the surface roughness of the film can be reduced, and excellent step coverage can be provided, the occurrence of encroachment can be prevented, the resistance of the tungsten film can be reduced and the peeling of the tungsten film can be reduced. The present invention has an excellent compatibility with the conventional low pressure CVD and can easily be practiced by making conventional semiconductor devices, which renders the present invention advantageous also from the viewpoint of profitability and efficiency.

While a preferred embodiment has been set forth along with modifications and variations to show specific advantageous details of the present invention, further embodiments, modifications and variations are contemplated within the broader aspects of the present invention, all as set forth by the spirit and scope of the following claims.

We claim:

1. A method of electronic device manufacturing, comprising the steps of:
   forming an insulating film on a surface of a semiconductor substrate;
   conducting blanket chemical vapor deposition (CVD) for depositing at least one or more of a metal and metallic compound on substantially the whole of the surface through the use of a source gas, and
   supplying the source gas as at least a metal halide and one fluoro-silane.

2. A method according to claim 1, wherein the fluoro-silane is difluoro-silane ($SiH_2F_2$).

3. A method according to claim 1, further comprising the step of forming a hole in said insulating film prior to said steps of conducting and depositing so that said depositing at least partly fills the hole.

4. A method according to claim 1, wherein said supplying supplies the fluoro-silane as one of $SiH_3F$, $SiH_2F_2$, $SiHF_3$, and $SiF_4$.

5. A method according to claim 4, including controlling selectivity by controlling the addition of $SiF_4$ in the source gas.

6. A method according to claim 1, wherein said conducting blanket CVD is at a reaction temperature of 300° C. to 800° C.

7. A method according to claim 1, wherein the fluoro-silane is $SiHF_3$.

8. A method according to claim 1, wherein the fluoro-silane is $SiH_3F$.

9. A method according to claim 1, wherein the fluoro-silane is $SiF_4$.

10. A method according to claim 1, including diluting the source gas with a carrier gas.

11. The method of claim 10, wherein said carrier gas is one of nitrogen, hydrogen, helium, and argon.

12. A method according to claim 1, wherein said conducting blanket CVD is at a reaction temperature of 200° C. to 800° C.

13. A method according to claim 12, wherein the depositing deposits a metal silicide.

14. A method according to claim 1, including forming a conductive adhesion layer on the substrate prior to said conducting.

15. A method according to claim 1, including forming a barrier layer on the substrate prior to said conducting.

16. A method according to claim 1, including monitoring the metal halide during said conducting.

17. A method according to claim 16, wherein the monitoring is with infrared spectroscopy.

18. A method according to claim 1, including monitoring the fluoro-silane during said conducting.

19. A method according to claim 18, wherein the monitoring is with infrared spectroscopy.

20. A method according to claim 1, wherein the source gas includes a reactive gas other than the fluorosilane.

21. A method according to claim 1, wherein said conducting and depositing deposits a metal.

22. A method according to claim 1, wherein said depositing and conducting blanket CVD deposit a metal silicide.

23. The method of claim 1, wherein said steps of conducting and depositing are conducted within a total pressure within the range of 0.01 to 10 Torr, and conducted with a reaction temperature range of 200°–800° C.

24. A method according to claim 23, wherein the source gas includes a fluoride of the metal to be deposited.

25. The method of claim 1, wherein said step of conducting comprises plasma CVD.

26. The method of claim 1, wherein said step of conducting comprises thermal CVD.

27. The method of claim 1, wherein said conducting and depositing deposits a metal silicide, uses a source gas of $SiH_2F_2$ and $WF_6$, and controls the ratio of these gases for the deposition of tungsten silicide.

28. A method according to claim 1, wherein the source gas includes a fluoride of the metal to be deposited.

29. A method according to claim 1, wherein said supplying supplies metal halide as tungsten hexafloride.

30. A method according to claim 1, wherein said supplying supplies metal halide as molybdenum hexafloride.

31. A method according to claim 1, further comprising the step of forming a hole in said insulating film prior to said steps of conducting and depositing so that said depositing at least partly fills the hole, and the step of forming a conductive adhesion layer in the hole after said forming a hole and before said conducting blanket CVD.

32. A method according to claim 31, wherein said conductive adhesion layer is one of TiW, TiN or W.

33. A method of electronic device manufacturing, comprising the steps of:
 forming a hole in an insulating film on a surface of a semiconductor substrate;
 conducting selective chemical vapor deposition (CVD) for depositing a metal within the hole of the insulating film through the use of a source gas;
 supplying the source gas as at least a metal halide and one fluoro-silane; and
 wherein said conducting selective CVD is conducted at a reaction temperature of 300° C. to 500° C.

34. A method according to claim 33, wherein said steps of conducting and depositing include metal fluoride in the source gas, are conducted with a total pressure within the range of 0.01 to 10 Torr, and are conducted within a reaction temperature range of 200°–800° C.

35. A method according to claim 33, wherein the semiconductor substrate has exposed on the surface thereof an insulating film and a silicon area, and said conducting and depositing forms a metal film selectively on the silicon area.

36. A method according to claim 33, wherein the semiconductor substrate has exposed on the surface thereof, a silicon-containing conductive area and said conducting and depositing forms a metal film selectively on the silicon-containing conductive area.

37. A method according to claim 33, wherein the semiconductor substrate has exposed on the surface thereof, a metal area and said conducting and depositing forms a metal film selectively on the metal area.

38. The method of claim 33, including controlling selectively by controlling the addition of $SiF_4$ in the source gas.

39. A method according to claim 33, wherein the fluorosilane is one of $SiH_3F$, $SiH_2F_2$, $SiHF_3$ and $SiF_4$.

40. A method according to claim 33, including diluting the source gas with a carrier gas.

41. A method according to claim 33, wherein the metal halide is tungsten hexafloride.

42. A method according to claim 33, wherein the metal halide is molybdenum hexafloride.

43. A method according to claim 33, wherein said conducting blanket CVD is at a reaction temperature of 200° C. to 800° C.

44. A method according to claim 33, further comprising the step of forming a hole in said insulating film prior to said steps of conducting and depositing so that said depositing at least partly fills the hole, and the step of forming a conductive adhesion layer in the hole after said forming a hole and before said conducting selective CVD.

45. A method according to claim 44, wherein said conductive adhesion layer is one of TiW, TiN or W.

46. A method of electronic device manufacturing, comprising the steps of:
 forming a hole in an insulating film on a surface of a semiconductor substrate;
 thereafter conducting selective chemical vapor deposition (CVD) for depositing metal within the hole of the insulating film through the use of a source gas; and
 supplying the source gas as at least a metal halide, $SiH_4$ and one fluoro-silane.

47. A method according to claim 46, including controlling selectivety by controlling the addition of the $SiF_4$ in the source gas.

48. A method according to claim 46, wherein said conducting selective CVD is conducted at a reaction temperature of 200° C. to 800° C.

49. A method according to claim 48, wherein the metal halide is tungsten hexafluoride.

50. A method according to claim 48, wherein the metal halide is molybdenum hexafluoride.

51. A method according to claim 46, wherein said conducting selective CVD is conducted at a reaction temperature of 300° C. to 500° C.

52. A method according to claim 46, wherein said fluoro-silane is one of $SiH_3F$, $SiH_2F_2$, $SiHF_3$, and $SiF_4$.

53. A method according to claim 46, including diluting the source gas with a carrier gas.

54. A method according to claim 46, wherein the metal halide is tungsten hexafloride.

55. A method according to claim 46, wherein the metal halide is molybdenum hexafloride.

56. A method according to claim 46, further comprising the step of forming a hole in said insulating film prior to said steps of conducting and depositing so that said forming a hole and before said conducting selective CVD.

57. A method according to claim 56, wherein said conductive adhesion layer is one of TiW, TiN or W.

* * * * *